United States Patent
Tasai et al.

(10) Patent No.: US 9,231,375 B2
(45) Date of Patent: Jan. 5, 2016

(54) SEMICONDUCTOR DEVICE (71) Applicants: Sony Corporation, Tokyo (JP); Sumitomo Electric Industries, Ltd., Osaka (JP)

(72) Inventors: Kunihiko Tasai, Tokyo (JP); Hiroshi Nakajima, Kanagawa (JP); Noriyuki Futagawa, Kanagawa (JP); Katsunori Yanashima, Kanagawa (JP); Yohei Enya, Hyogo (JP); Tetsuya Kumano, Osaka (JP); Takashi Kyono, Osaka (JP)

(73) Assignees: Sony Corporation, Tokyo (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/765,375

(22) Filed: Feb. 12, 2013

(65) Prior Publication Data

US 2013/0208747 A1  Aug. 15, 2013

(30) Foreign Application Priority Data

Feb. 14, 2012  (JP) .................................. 2012-029042

(51) Int. Cl.
*H01S 5/00* (2006.01)
*H01S 5/30* (2006.01)
(Continued)

(52) U.S. Cl.
CPC ............... *H01S 5/3013* (2013.01); *B82Y 20/00* (2013.01); *H01S 5/0014* (2013.01);
(Continued)

(58) Field of Classification Search
CPC . H01S 5/3202; H01S 5/34333; H01S 5/2201; H01S 5/3211; H01S 5/1082; H01S 5/3013; H01S 5/3213; H01S 5/32341; H01S 5/0206; H01S 5/2206
USPC ...................... 372/44.01, 43.01, 44.011, 50.1
See application file for complete search history.

(56) References Cited

U.S. PATENT DOCUMENTS 8,483,251 B2 * 7/2013 Enya et al. ................ 372/44.011
8,513,684 B2 * 8/2013 Kyono et al. .................... 257/94
(Continued)

FOREIGN PATENT DOCUMENTS

JP  2002-335052  11/2002
JP  2010-212651  9/2010
(Continued)

OTHER PUBLICATIONS

WO2010/131511 A (English translation) pp. 1-15.*
(Continued)

*Primary Examiner* — Jessica Stultz
*Assistant Examiner* — Delma R Forde
(74) *Attorney, Agent, or Firm* — K&L Gates LLP (57) ABSTRACT A semiconductor device includes: a semiconductor substrate made of a hexagonal Group III nitride semiconductor and having a semi-polar plane; and an epitaxial layer formed on the semi-polar plane of the semiconductor substrate and including a first cladding layer of a first conductive type, a second cladding layer of a second conductive type, and a light-emitting layer formed between the first cladding layer and the second cladding layer, the first cladding layer being made of $In_{x1}Al_{y1}Ga_{1-x1-y1}N$, where x1>0 and y1>0, the second cladding layer being made of $In_{x2}Al_{y2}Ga_{1-x2-y2}N$, where 0≤x2≤about 0.02 and about 0.03≤y2≤about 0.07.

6 Claims, 7 Drawing Sheets (51) Int. Cl.
*H01S 5/32* (2006.01)
*H01S 5/343* (2006.01)
*B82Y 20/00* (2011.01)
*H01S 5/20* (2006.01)

(52) U.S. Cl.
CPC ............ H01S 5/3202 (2013.01); H01S 5/3213 (2013.01); H01S 5/34333 (2013.01); *H01S 5/0035* (2013.01); *H01S 5/2031* (2013.01); *H01S 5/3211* (2013.01)

(56) References Cited

U.S. PATENT DOCUMENTS

2009/0252191 A1* 10/2009 Kubota et al. .............. 372/50.11
2010/0322276 A1* 12/2010 Yoshizumi et al. ...... 372/44.011
2012/0269222 A1* 10/2012 Kyono et al. ............ 372/45.011
2012/0327967 A1* 12/2012 Enya et al. ............... 372/45.011
2013/0177035 A1* 7/2013 Kyono et al. ............. 372/45.01

FOREIGN PATENT DOCUMENTS

| | | |
|---|---|---|
| JP | 2011-258843 | 12/2011 |
| JP | 2012-015545 | 1/2012 |

OTHER PUBLICATIONS

WO2010131526 (English translation).*
T. Kyono et al., "World's First True Green Laser Diodes on Novel Semi-Polar GaN Substrates I". (15 pages).
M. Adachi et al., "World's First True Green Laser Diodes on Novel Semi-Polar GaN Substrates II". (11 pages).
International Search Report issued May 14, 2013 for corresponding Intl. Appln. PCT/JP2013/052566.

* cited by examiner

SEMICONDUCTOR DEVICE

CROSS REFERENCES TO RELATED APPLICATIONS

The present application claims priority to Japanese Priority Patent Application JP 2012-029042 filed in the Japan Patent Office on Feb. 14, 2012, the entire content of which is hereby incorporated by reference.

BACKGROUND

The present disclosure relates to a semiconductor device, and more specifically the disclosure relates to a hexagonal Group III nitride semiconductor device.

Laser diodes are presently utilized in numerous technical fields, and in particular, the laser diodes are indispensable optical devices in the field of image display units, for example, televisions and projectors. In the application of laser diodes to this field, laser diodes emitting light of respective light's primary colors, i.e., red, green, and blue are typically used, and an improvement in laser characteristics are also desired.

Japanese Unexamined Patent Application Publication No. 2002-335052 discloses a nitride-based laser diode device used in a short wavelength region of about 375 nm or less and having a configuration in which a nitride semiconductor layer including Al and In is formed in one or both of two cladding layers sandwiching an active layer (a light-emitting layer). In Japanese Unexamined Patent Application Publication No. 2002-335052, for example, an n-side cladding layer and a p-side cladding layer are made of InAlGaN and AlGaN, respectively, to achieve suppression of crystallinity deterioration and an improvement in device characteristics.

Red and blue laser diodes have been already practically used, and in recent years, green laser diodes (with a wavelength of about 500 nm to about 560 nm both inclusive) have been actively developed (for example, refer to Takashi Kyono, et al., "The world's first true green laser diodes on novel semi-polar {2, 0, -2, 1} GaN substrate I", Jan. 2010, SEI Technical Review, Vol. 176, pp. 88-92, and Masahiro Adachi, et al., "The world's first true green laser diodes on novel semi-polar {2, 0, -2, 1} GaN substrate II", January 2010, SEI Technical Review, Vol. 176, pp. 93-96). In Takashi Kyono, et al. and Masahiro Adachi, et al., there is proposed a Group III nitride laser diode (a green laser diode) in which an n-type cladding layer, a light-emitting layer including an active layer made of InGaN, and a p-type cladding layer, that is, laser components are laminated in this order on a {2, 0, -2, 1} semi-polar plane of an n-type GaN substrate. It is to be noted that, in this specification, plane orientation of a hexagonal crystal is represented by {h, k, l, m}, where h, k, l, and m are plane indices.

In Takashi Kyono, et al. and Masahiro Adachi, et al., a green laser diode having superior crystal quality while suppressing an influence of a piezoelectric field is achieved through forming an epitaxial layer on the semi-polar plane of a GaN substrate by crystal growth. However, in a laser diode device in which a device is formed on a semi-polar plane of a semiconductor substrate, characteristics of the substrate and characteristics of the epitaxial layer formed on or above the substrate are different from those in a laser diode device in which a device is formed on a polar plane of a semiconductor substrate. Therefore, further development of laser diodes using a semi-polar plane of a semiconductor substrate is desired.

SUMMARY

It is desirable to provide a semiconductor device reducing an operating voltage and having superior reliability in a nitride-based semiconductor device using a semi-polar substrate.

According to an embodiment of the disclosure, there is provided a semiconductor device including: a semiconductor substrate made of a hexagonal Group III nitride semiconductor and having a semi-polar plane; and an epitaxial layer formed on the semi-polar plane of the semiconductor substrate and including a first cladding layer of a first conductive type, a second cladding layer of a second conductive type, and a light-emitting layer formed between the first cladding layer and the second cladding layer, the first cladding layer being made of $In_{x1}Al_{y1}Ga_{1-x1-y1}N$, where x1>0 and y1>0, the second cladding layer being made of $In_{x2}Al_{y2}Ga_{1-x2-y2}N$, where 0≤x2≤about 0.02 and about 0.03≤y2≤about 0.07.

In the semiconductor device according to the embodiment of the disclosure, an Al composition ratio y2 of the second cladding layer is about 0.07 or less; therefore, an oxygen concentration in the second cladding layer is reduced, and an operating voltage is reduced. Moreover, since the Al composition ratio y2 is about 0.03 or over, an optical confinement factor is increased, and internal loss is reduced, thereby reducing a threshold current.

According to the embodiment of the disclosure, in a nitride-based semiconductor device using a semi-polar substrate, the operating voltage is reduced; therefore, a semiconductor device with high reliability is obtainable.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the technology, and are incorporated in and constitute a part of this specification. The drawings illustrate embodiments and, together with the specification, serve to explain the principles of the technology.

DETAILED DESCRIPTION

A semiconductor device according to an embodiment of the disclosure will be described as a laser diode device referring to the accompanying drawings. The embodiment of the present disclosure will be described in the following order. It is to be noted that the present disclosure is not limited to the following examples.

1. Configuration of Laser Diode Device
2. Configuration of Second Cladding Layer
(1. Configuration of Laser Diode Device)
[Entire Configuration of Laser Diode Device]

Figure 1:
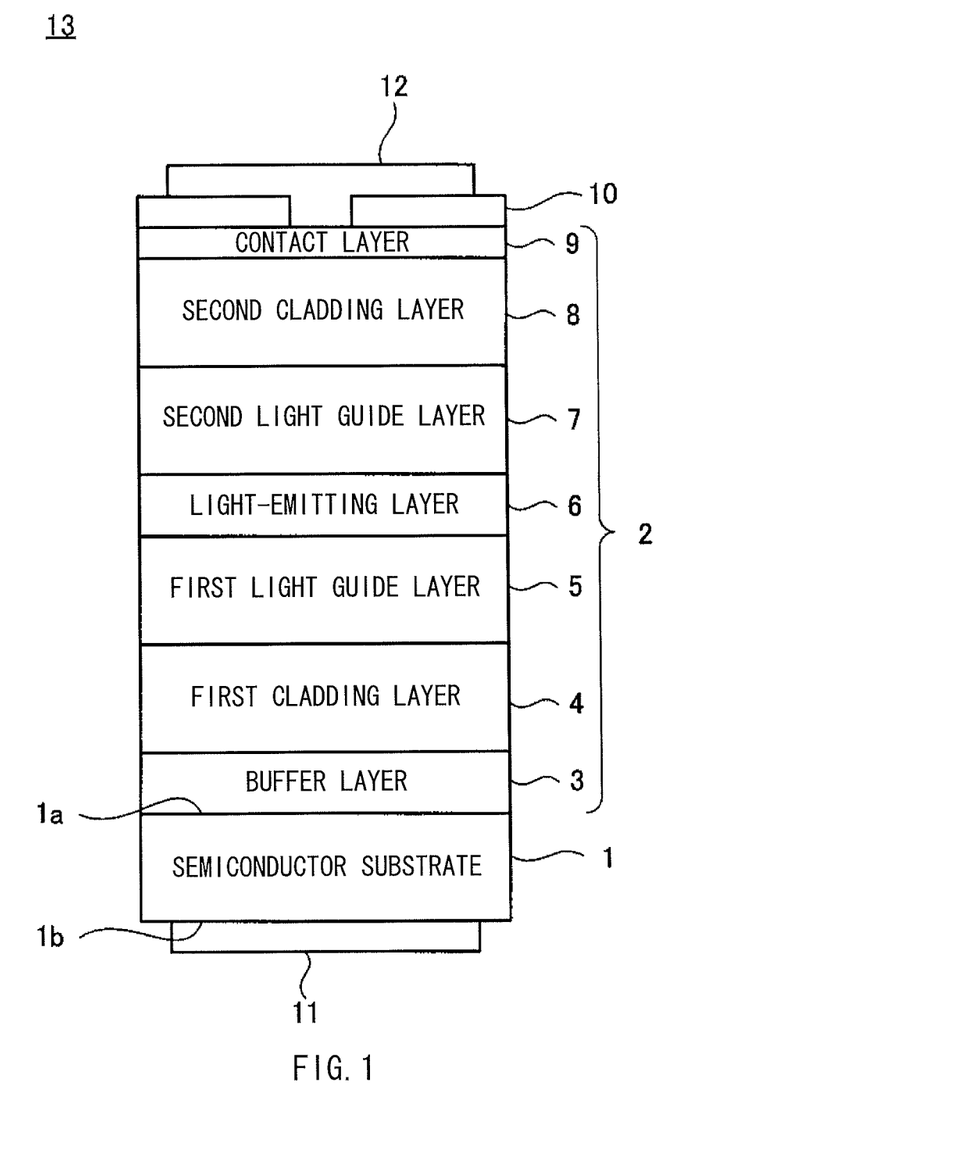
FIG. 1 is a schematic sectional view of a laser diode device according to an embodiment of the disclosure.

FIG. 1 illustrates a schematic sectional view of the laser diode device according to an embodiment of the disclosure. A laser diode device 13 includes a semiconductor substrate 1, an epitaxial layer 2, an insulating layer 10, a first electrode 12, and a second electrode 11. In the laser diode device 13 according to the embodiment, the epitaxial layer 2, the insulating layer 10, and the first electrode 12 are formed in this order on one surface 1a of the semiconductor substrate 1. Moreover, the second electrode 11 is formed on the other surface 1b of the semiconductor substrate 1. It is to be noted that, as will be described later, the semiconductor substrate 1 is a semi-polar base having, for example, a {2, 0, -2, 1} semi-polar plane or the like as a semi-polar plane 1a, and the epitaxial layer 2, the insulating layer 10, and the first electrode 12 are laminated in a direction of a normal to the semi-polar plane 1a.

Although not illustrated, the laser diode device 13 has a substantially rectangular parallelepiped shape, and a pair of facets (side surfaces) facing each other of a laminate sandwiched between the first electrode 12 and the second electrode 11 serve as resonator facets. A length between the pair of resonator facets is, for example, about several hundreds of micrometers.

[Configurations of Respective Components]

Next, configurations of respective components of the laser diode device 13 according to the embodiment will be described in detail below.

(1) Semiconductor Substrate

The semiconductor substrate 1 is made of, for example, a hexagonal Group III nitride semiconductor such as GaN, AlN, AlGaN, InGaN, or InAlGaN. Moreover, as the semiconductor substrate 1, a substrate of which conductivity of carriers is n-type may be used. In the embodiment, one surface where the epitaxial layer 2, the insulating layer 10, and the first electrode 12 are formed of the semiconductor substrate 1 configures the semi-polar plane 1a, instead of a c-plane (a polar plane).

Figure 2A:
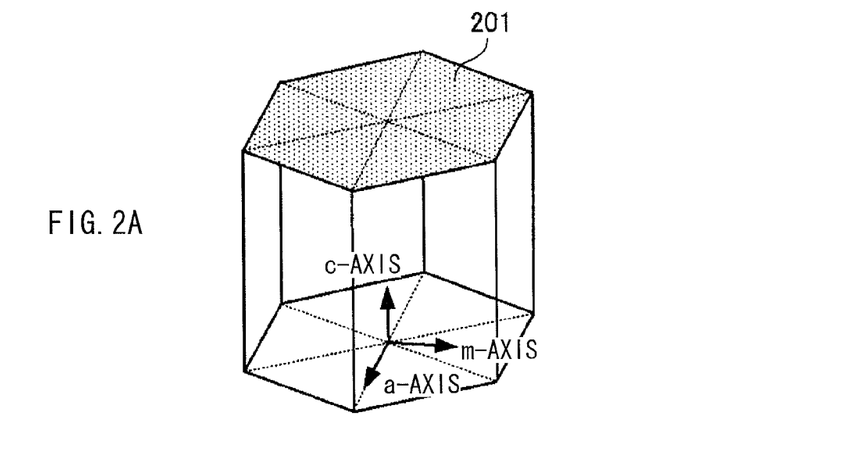
FIGS. 2A and 2B are diagrams illustrating a "c" plane and an "m" plane in a crystal structure of GaN, respectively.
Figure 2B:
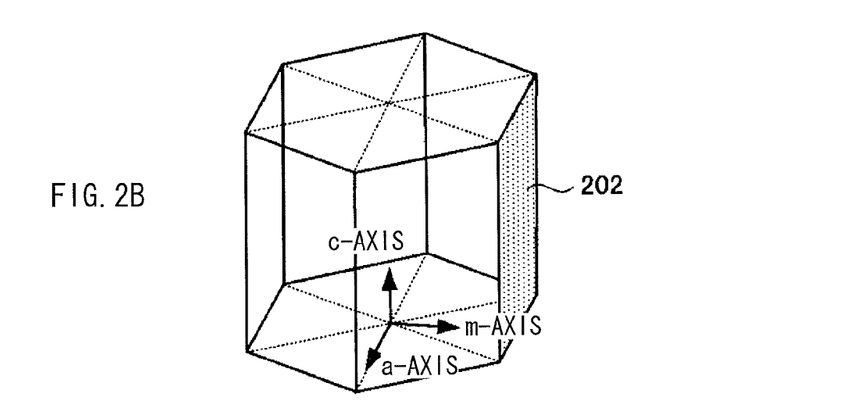
Figure 3:
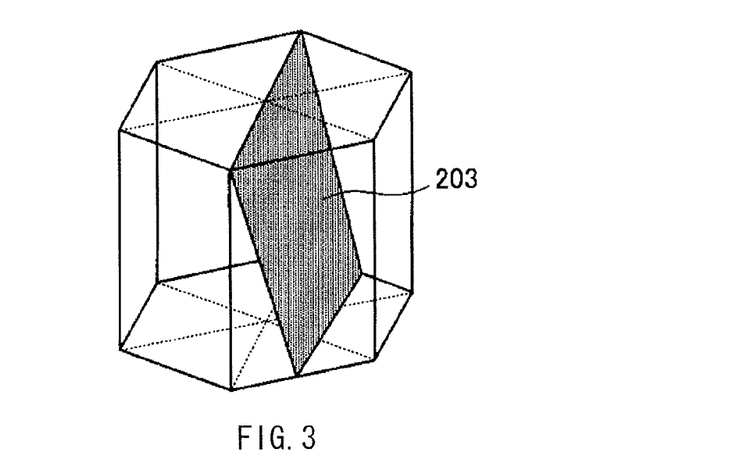
FIG. 3 is a diagram illustrating a semi-polar plane in the crystal structure of GaN.

FIGS. 2A, 2B, and 3 illustrate a crystal structure of GaN. As illustrated in FIGS. 2A and 2B, GaN has a crystal structure called "hexagonal crystal", and a piezoelectric field generated in a light-emitting layer is generated along a c-axis; therefore, a c-plane 201 (a {0, 0, 0, 1} plane) orthogonal to the c-axis has polarity, and is called "polar plane". On the other hand, since an m-plane 202 (a {1, 0, -1, 0} plane) orthogonal to an m-axis is parallel to the c-axis, the m-plane 202 is non-polar, and is called "non-polar plane". On the contrary, a plane having a normal tilted at a predetermined angle with respect to the c-axis toward the m-axis, for example, a plane (a {2, 0, -2, 1} plane 203) having a normal tilted at 75° with respect to the c-axis toward the m-axis in an example illustrated in FIG. 3 is an intermediate plane between the c-plane and the m-plane, and is called "semi-polar plane". The semi-polar plane has a property of being relaxed more easily than the c-plane.

When the epitaxial layer 2, the insulating layer 10, and the first electrode 12 are formed on the semi-polar plane 1a of the semiconductor substrate 1 as in the embodiment, for example, green light with a wavelength around 500 nm is allowed to be oscillated.

As the semi-polar plane 1a, a crystal plane having a normal tilted at an angle ranging from about 45° to about 80° both inclusive or from about 100° to about 135° both inclusive with respect to the c-axis toward an the m-axis may be used.

Moreover, to obtain emission of light with a long wavelength, an angle between the normal to the semi-polar plane 1a and the c-axis is preferably within a range from about 63° to about 80° both inclusive or from about 100° to about 117° both inclusive. Within these angle ranges, piezoelectric polarization in a light-emitting layer 6 which will be described later in the epitaxial layer 2 is reduced, and In is favorably introduced during active layer growth (formation) to allow a variable range of In composition ratio in the light-emitting layer 6 (the active layer) to be expanded. Therefore, emission of light with a long wavelength is easily obtainable with the angle between the normal to the semi-polar plane 1a and the c-axis set within the above-described angle ranges.

As the semi-polar plane 1a having the normal within the angle ranges, for example, a crystal plane such as a {2, 0, -2, 1} plane, a {1, 0, -1, 1} plane, a {2, 0, -2, -1} plane, or a {1, 0, -1, -1} plane may be used. It is to be noted that a crystal plane slightly tilted at about ±4° with respect to any of these crystal planes may be used as the semi-polar plane 1a. In the embodiment, n-type GaN is used for the semiconductor substrate 1, and a {2, 0, -2, 1} plane of the semiconductor substrate 1 serves as one main plane. Since GaN is a gallium-nitride-based semiconductor which is a binary compound, a stable substrate plane (a main plane) with high crystal quality is able to be provided.

(2) Epitaxial Layer, Insulating Layer, First Electrode, Second Electrode

Next, the epitaxial layer 2, the insulating layer 10, the first electrode 12, and the second electrode 11 of the laser diode device 13 according to the embodiment will be described below.

In the embodiment, as illustrated in FIG. 1, the epitaxial layer 2 includes a buffer layer 3, a first cladding layer 4, a first light guide layer 5, the light-emitting layer 6, a second light guide layer 7, a second cladding layer 8, and a contact layer 9. The buffer layer 3, the first cladding layer 4, the first light guide layer 5, the light-emitting layer 6, the second light guide layer 7, the second cladding layer 8, and the contact layer 9 are laminated in this order on the semi-polar plane 1a of the semiconductor substrate 1.

The buffer layer 3 is formed on the semi-polar plane 1a as one main plane of the semiconductor substrate 1, and is configured of a gallium-nitride-based semiconductor layer doped with an n-type dopant. More specifically, the buffer layer 3 may be configured of, for example, an n-type GaN layer, and Si may be used as an n-type dopant.

The first cladding layer 4 is formed on the buffer layer 3, and is configured of one or more gallium-nitride-based semiconductor layers doped with an n-type dopant. More specifically, the first cladding layer 4 may be configured of an n-type $In_{x1}Al_{y1}Ga_{1-x1-y1}N$ layer, where x1>0 and y1>0, and Si may be used as an n-type dopant. Since the first cladding layer 4 is made of a quaternary system of InAlGaN, a band gap is adjustable while obtaining a lattice match to the semi-polar plane 1a of the semiconductor substrate 1. The first cladding layer 4 preferably has a thickness of, for example, about 700 nm or over.

The first light guide layer 5 is formed on the first cladding layer 4, and is configured of one or more gallium-nitride-based semiconductor layers. More specifically, the first light guide layer 5 may be configured of, for example, a non-doped or n-type GaN layer, a non-doped or n-type InGaN layer, or a non-doped or n-type InAlGaN layer, and Si may be used as an n-type dopant.

The light-emitting layer 6 is formed on the first light guide layer 5, and is configured through alternately laminating a well layer and a barrier layer (both not illustrated) configured of non-doped, that is, not doped with impurities, or n-type gallium-nitride-based semiconductor layers. More specifically, the well layer and the barrier layer are configured of, for example, non-doped or n-type AlGaN layers, non-doped or n-type GaN layers, non-doped or n-type InGaN layers, or non-doped or n-type InAlGaN layers, and Si may be used as an n-type dopant. At this time, the barrier layer is configured to have a band gap larger than a band gap of the well layer.

The light-emitting layer 6 may have a single quantum well structure including one well layer or a multiple quantum well structure in which a plurality of well layers and a plurality of barrier layers are alternately disposed. In the embodiment, the light-emitting layer 6 oscillating light with a wavelength of about 430 nm to about 570 nm both inclusive may be formed through laminating respective layers on the semi-polar plane 1a of the semiconductor substrate 1. Moreover, the configuration of the laser diode device 13 according to the embodiment is suitable for oscillation of light with a wavelength of about 480 nm to about 550 nm both inclusive.

The second light guide layer 7 is formed on the light-emitting layer 6, and is configured of one or more gallium-nitride-based semiconductor layers. More specifically, the second light guide layer 7 may be configured of, for example, a non-doped or p-type GaN layer or a non-doped or p-type InGaN layer, and Mg may be used as a p-type dopant.

The second cladding layer 8 is formed on the second light guide layer 7, and is configured of one or more gallium-nitride-based semiconductor layers. More specifically, the second cladding layer 8 may be configured of a p-type $In_{x2}Al_{y2}Ga_{1-x2-y2}N$ layer, where $0 \leq x2 \leq$ about 0.02 and about $0.03 \leq y2 \leq$ about 0.07, and Mg may be used as a p-type dopant. Moreover, the second cladding layer 8 preferably has a thickness of, for example, about 200 nm or over. In the laser diode device 13 according to the embodiment, in particular, a voltage and a threshold current are reduced through specifying the composition of the second cladding layer 8 within a more preferable range. Factors determining preferable composition of the second cladding layer 8 and a thickness of the second cladding layer 8 will be described later.

The contact layer 9 is formed on the second cladding layer 8, and is configured of a gallium-nitride-based semiconductor layer doped with a p-type dopant. More specifically, the contact layer 9 may be configured of, for example, a p-type GaN layer, and Mg may be used as a p-type dopant.

The insulating layer 10 is formed on the contact layer 9, and has an opening in a part thereof. The insulating layer 10 may be formed of, for example, an insulating material such as $SiO_2$ or SiN.

The first electrode 12 is configured of one or more conductive films, and is formed on the insulating layer 10 including the contact layer 9 exposed from the opening of the insulating layer 10, and is electrically connected to the contact layer 9. A material which is ohmic-contactable with the contact layer 9 may be used as a conductive material forming the first electrode 12. The first electrode 12 may be configured of, for example, a Pd film, and may be configured of a single layer or a plurality of layers.

The second electrode 11 is configured of one or more conductive films, and is formed on the other plane (a back surface 1b) of the semiconductor substrate 1. The second electrode 11 may be configured of, for example, an Al film, and may be configured of one layer or a plurality of layers. In the embodiment, when a desired current flows between the first electrode 12 and the second electrode 11, green laser light with a wavelength of about 480 nm to about 550 nm both inclusive is obtained.

(2. Configuration of Second Cladding Layer)

Inventors of the present disclosure carried out various verifications of the configuration of the second cladding layer 8 in the laser diode device 13 according to the embodiment to find out a preferable composition of the second cladding layer 8 and a preferable thickness of the second cladding layer 8.

In the case where the concentration of Al forming the second cladding layer 8 is high, oxygen (O) in the second cladding layer 8 is increased to reduce a p-type carrier concentration in the second cladding layer 8 which is essentially p-type, resulting in an increased operating voltage. On the other hand, in terms of optical confinement and internal loss, the higher the Al concentration is, the lower a threshold current is obtained. A critical film thickness specifying a range where coherent growth is possible is also varied by the Al composition. Therefore, in the embodiment, a preferable range of the composition of the second cladding layer 8 was determined in terms of mainly an oxygen concentration limit, a critical film thickness (a lattice mismatch limit), and a low threshold current.

An experiment verifying preferable ranges of an Al composition ratio and an In composition ratio in the second cladding layer 8 in the laser diode device 13 according to the embodiment will be described below. A plurality of laser diode devices with different compositions of the second cladding layer 8 were fabricated, and the experiment was carried out on the laser diode devices as samples.

First, the oxygen concentrations contained in samples (laser diode devices) 1 to 3 in which an In composition ratio x2 and Al composition ratio y2 of the second cladding layer 8 made of $In_{x2}Al_{y2}Ga_{1-x2-y2}N$ were varied, and volt-ampere characteristics of the samples 1 to 3 were measured.

[Sample 1]

Composition of the semiconductor substrate 1 and the respective layers of the epitaxial layer 2 configuring the laser diode device according to the sample 1 will be described below.

The semiconductor substrate 1 was configured of an n-type GaN layer, and a {2, 0, −2, 1} semi-polar plane served as a crystal growth plane. The buffer layer 3 was configured of an n-type GaN layer with a thickness of 1100 nm. Moreover, in the buffer layer 3, Si was used as an n-type impurity. The first cladding layer 4 was configured of an n-type $In_{0.03}Al_{0.14}Ga_{0.83}N$ layer with a thickness of 1200 nm. Moreover, in the first cladding layer 4, Si was used as an n-type impurity.

The first light guide layer 5 had a three-layer configuration (not illustrated) including a first crystal layer, a second crystal layer, and a third crystal layer formed in this order of closeness to the first cladding layer 4. The first crystal layer of the first light guide layer 5 was configured of an n-type GaN layer with a thickness of 250 nm. Moreover, in the first crystal layer, Si was contained as an n-type impurity. The second crystal layer of the first light guide layer 5 was configured of an n-type $In_{0.045}Ga_{0.955}N$ layer with a thickness of 114 nm. In the second crystal layer, Si was contained as an n-type impurity. The third crystal layer of the first light guide layer 5 was configured of a non-doped $In_{0.045}Ga_{0.955}N$ layer with a thickness of 1 nm.

The light-emitting layer 6 was made of non-doped $In_{0.3}Ga_{0.7}N$ with a thickness of 3 nm. The second light guide layer 7 had a three-layer configuration (not illustrated) including a first crystal layer, a second crystal layer, and a third crystal layer formed in this order of closeness to the light-emitting layer 6. The first crystal layer of the second light guide layer 7 was configured of a non-doped $In_{0.025}Ga_{0.975}N$ layer with a thickness of 75 nm. The second crystal layer of the second light guide layer 7 was configured of a p-type GaN layer with a thickness of 15 nm. In the second crystal layer, Mg was used as a p-type impurity. The third crystal layer of the second light guide layer 7 was configured of a p-type GaN layer with a thickness of 200 nm. In the third crystal layer, Mg was contained as a p-type impurity.

The second cladding layer 8 had a two-layer configuration (not illustrated) including a first crystal layer and a second crystal layer formed in this order of closeness to the second light guide layer 7. The first crystal layer and the second crystal layer of the second cladding layer 8 were configured of p-type $Al_{0.03}Ga_{0.97}N$ layers with different impurity concentrations, and each had a thickness of 200 nm. In the first crystal layer and the second crystal layer of the second cladding layer 8, Mg was used as a p-type impurity.

The contact layer 9 had a two-layer configuration (not illustrated) including a first crystal layer and a second crystal layer formed in this order of closeness to the second cladding layer 8. The first crystal layer and the second crystal layer of the contact layer 9 were configured of p-type GaN layers with different impurity concentrations, and the first crystal layer and the second crystal layer were formed to have thicknesses of 40 nm and 10 nm, respectively. Moreover, in the first crystal layer and the second crystal layer of the contact layer 9, Mg was used as a p-type impurity.

[Sample 2]

The sample 2 is different from the sample 1 in only the composition of the second cladding layer 8; therefore, only the configuration of the second cladding layer 8 will be described below, and configurations of the other layers will not be further described.

In the sample 2, the second cladding layer 8 has a two-layer configuration including a first crystal layer and a second crystal layer formed in this order of closeness to the second light guide layer 7. In the sample 2, the first crystal layer and the second crystal layer of the second cladding layer 8 were configured of p-type $In_{0.015}Al_{0.07}Ga_{0.915}N$ layers with different impurity concentrations, each having a thickness of 200 nm. In the first crystal layer and the second crystal layer of the second cladding layer 8, Mg was used as a p-type impurity.

[Sample 3]

The sample 3 is different from the sample 1 in only the composition of the second cladding layer 8; therefore, only the configuration of the second cladding layer 8 will be described below, and the configuration of the other layers will not be further described.

In the sample 3, the second cladding layer 8 has a two-layer configuration including a first crystal layer and a second crystal layer formed in this order of closeness to the second light guide layer 7. In the sample 3, the first crystal layer and the second crystal layer of the second cladding layer 8 were configured of p-type $In_{0.03}Al_{0.14}Ga_{0.83}N$ layers with different impurity concentrations, each having a thickness of 200 nm. In the first crystal layer and the second crystal layer of the second cladding layer 8, Mg was used as a p-type impurity.

Figure 4:
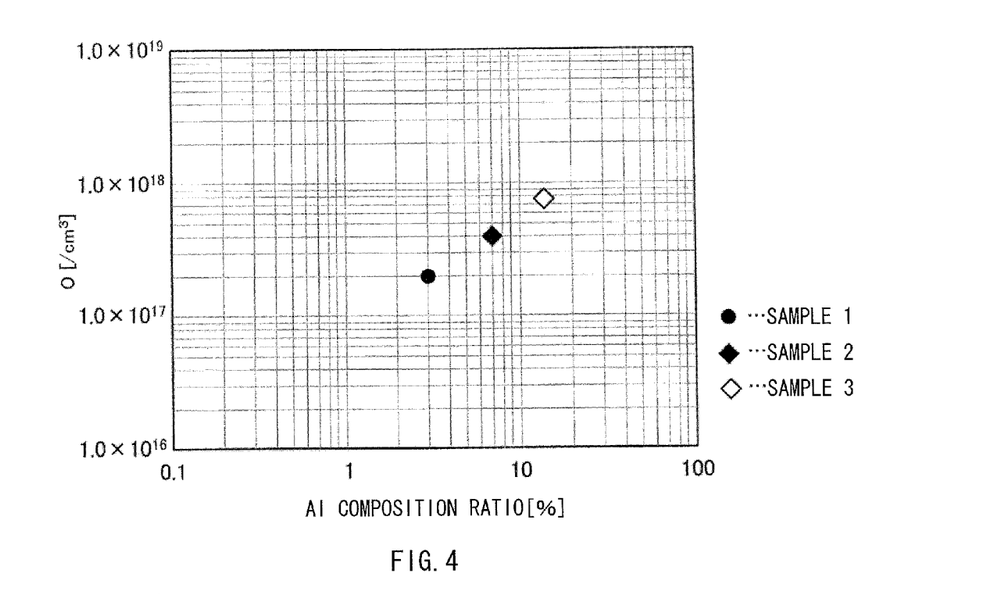
FIG. 4 is a plot illustrating oxygen concentrations in second cladding layers in samples 1 to 3.
Figure 5:
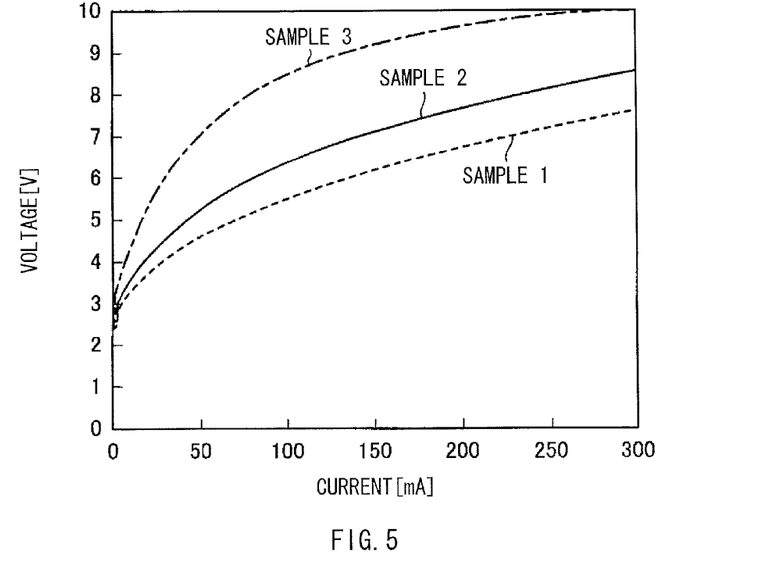
FIG. 5 is a plot illustrating volt-ampere characteristics in the samples 1 to 3.

FIG. 4 is a plot illustrating oxygen concentrations in the second cladding layers 8 in the samples 1 to 3. In FIG. 4, a horizontal axis represents the Al composition ratio in the second cladding layer 8, and a vertical axis represents the oxygen concentration in the second cladding layer 8. Moreover, FIG. 5 illustrates volt-ampere characteristics in the samples 1 to 3. In FIG. 5, a horizontal axis represents a current value, and a vertical axis represents a voltage value.

It is found out from FIG. 4 that the oxygen concentration in the second cladding layer 8 has dependence on the Al composition ratio in the second cladding layer 8, and the oxygen concentration is decreased with a decrease in the Al composition ratio. On the other hand, it is found out from FIG. 5 that a voltage with respect to a same current is decreased with a decrease in the Al composition ratio in the second cladding layer 8. As described above, this is because an increase in the oxygen concentration in the second cladding layer 8 causes a decrease in the p-type carrier concentration in the second cladding layer 8, which leads to an increase in resistance.

As illustrated in FIGS. 4 and 5, it was confirmed that the oxygen (impurity) concentration contained in the second cladding layer 8 was decreased through decreasing the Al composition ratio of the second cladding layer 8, thereby enabling a reduction in voltage. Moreover, it was confirmed that, compared to the sample 3 (with an Al composition ratio of 0.14 and an oxygen concentration of $8.0 \times 10^{17}/cm^3$), a lower voltage was achievable in the sample 2; and compared to the sample 2, a lower voltage was achievable in the sample 1. A noticeable difference in voltage between the sample 3 and the sample 2 was observed. Therefore, in terms of the oxygen concentration, it may be said that the Al composition ratio of the second cladding layer 8 is preferably about 0.07 or less.

The critical film thickness is one factor determining the Al composition ratio of the second cladding layer 8. The critical film thickness is a film thickness limit for coherent growth of an epitaxial layer, and the value of the critical film thickness varies with varying the composition ratio of the epitaxial layer. Therefore, the critical film thickness was evaluated with use of samples (laser diode devices) 1 and 4 to 8 with different Al composition ratios y2 of the second cladding layer 8 made of $In_{x2}Al_{y2}Ga_{1-x2-y2}N$, where x2=0 and y2>0. The sample 1 is the above-described sample 1. Composition of each of the samples 4 to 8 will be described below.

[Sample 4]

The sample 4 is different from the sample 1 in only the composition of the second cladding layer 8; therefore, only the configuration of the second cladding layer 8 will be described below, and configurations of the other layers will not be further described.

The second cladding layer 8 in the sample 4 had a two-layer configuration including a first crystal layer and a second crystal layer in this order of closeness to the second light guide layer 7. In the sample 4, the first crystal layer and the second crystal layer of the second cladding layer 8 were configured of p-type $Al_{0.04}Ga_{0.96}N$ layers with different impurity concentrations, each having a thickness of 200 nm. In the first crystal layer and the second crystal layer of the second cladding layer 8, Mg was used as a p-type impurity.

[Sample 5]

The sample 5 is different from the sample 1 in only the composition and the thickness of the second cladding layer 8; therefore, only the configuration of the second cladding layer 8 will be described below, and the configurations of the other layers will not be further described.

The second cladding layer 8 in the sample 5 had a single-layer configuration, and was configured of a p-type $Al_{0.04}Ga_{0.96}N$ layer with a thickness of 250 nm. Moreover, Mg was used as a p-type impurity.

[Sample 6]

The sample 6 is different from the sample 1 in only the composition of the second cladding layer 8; therefore, only the configuration of the second cladding layer 8 will be described below, and the configurations of the other layers will not be further described.

The second cladding layer in the sample 6 had a two-layer configuration including a first crystal layer and a second crystal layer formed in this order of closeness to the second light guide layer 7. The first crystal layer and the second crystal layer of the second cladding layer 8 in the sample 6 were configured of p-type $Al_{0.05}Ga_{0.95}N$ layers with different impurity concentrations, each having a thickness of 200 nm. In the first crystal layer and the second crystal layer of the second cladding layer 8, Mg was used as a p-type impurity.

[Sample 7]

The sample 7 is different from the sample 1 in only the composition of the second cladding layer 8; therefore, only the configuration of the second cladding layer 8 will be described below, and the configurations of the other layers will not be further described.

The second cladding layer 8 in the sample 7 had a two-layer configuration including a first crystal layer and a second crystal layer formed in this order of closeness to the second light guide layer 7. The first crystal layer and the second crystal layer of the second cladding layer 8 in the sample 7 were configured of $Al_{0.07}Ga_{0.93}N$ layers with different impurity concentration, each having a thickness of 200 nm. In the first crystal layer and the second crystal layer of the second cladding layer 8, Mg was used as a p-type impurity.

[Sample 8]

The sample 8 is different from the sample 1 in only the composition of the second cladding layer 8; therefore, only the configuration of the second cladding layer 8 will be described below, and the configurations of the other layers will not be further described.

The second cladding layer 8 in the sample 8 had a two-layer configuration including a first crystal layer and a second crystal layer in this order of closeness to the second light guide layer 7. The first crystal layer and the second crystal layer of the second cladding layer 8 in the sample 8 were configured of p-type $Al_{0.10}Ga_{0.90}N$ layers with different impurity concentrations, each having a thickness of 200 nm. In the first crystal layer and the second crystal layer of the second cladding layer 8, Mg was used as a p-type impurity.

Figure 6:
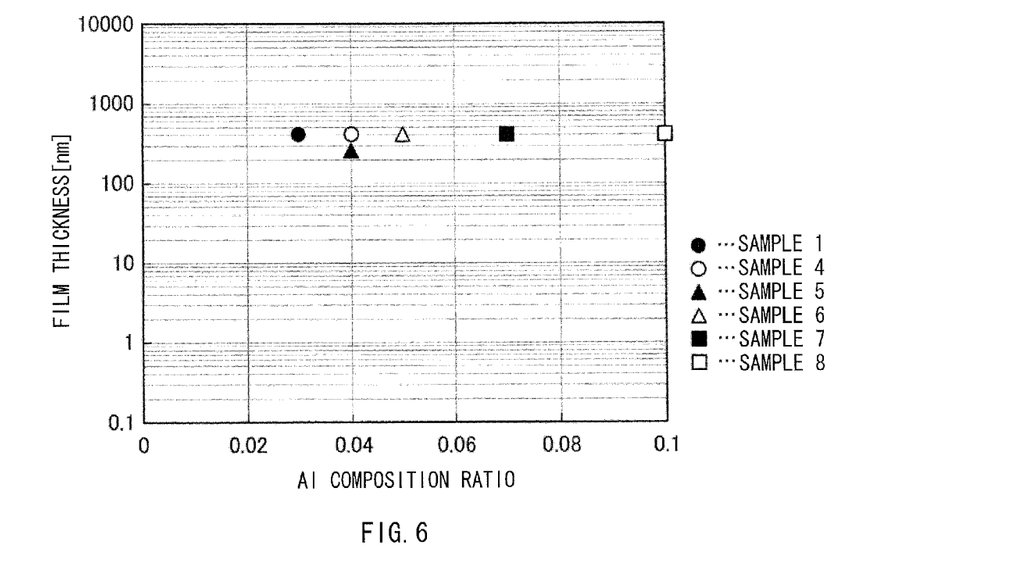
FIG. 6 is a plot illustrating observations of second cladding layers in the sample 1 and samples 4 to 8.
Figure 7:
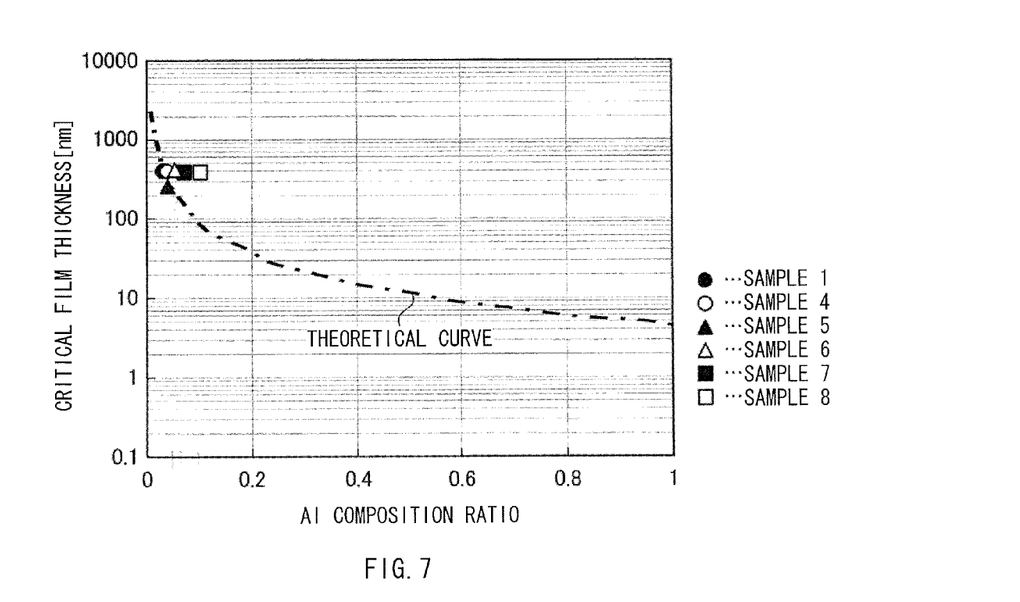
FIG. 7 is a plot illustrating a superimposing of a theoretical curve of a critical film thickness upon the observations of the second cladding layers in the sample 1 and the samples 4 to 8.

FIG. 6 illustrates a relationship of the second cladding layers 8 in the samples 1 and 4 to 8. Moreover, FIG. 7 illustrates a theoretical curve of the critical film thickness with respect to the Al composition ratio. Characteristic points in FIG. 6 are also illustrated in FIG. 7. In FIG. 6, a horizontal axis represents the Al composition ratio, and a vertical axis represents the film thickness. Herein, the theoretical curve illustrated in FIG. 7 is a calculated critical film thickness with respect to an Al composition ratio in the case where an AlGaN layer is epitaxially grown on a {1, 1, −2, 2} plane of a GaN substrate, and is quoted from a calculation result by D. Holec, et al (D. Holec, et al, J. Appl. Phys. 104, 123514(2008)). The theoretical curve represents the film thickness limit for coherent growth (critical film thickness), and a region below the theoretical curve is a coherent growth region, and a region above the theoretical curve is a lattice relaxation growth region.

In an experiment, X-ray diffraction reciprocal lattice mapping measurement was performed on the samples 1 and 4 to 8. As a result, in the samples 1 and 4 to 6, the second cladding layer 8 coherently grown along an a-axis direction was observed, and in the samples 7 and 8, the second cladding layer 8 grown at a tilt around the a-axis as a rotation axis was observed.

Moreover, it is found out from FIG. 7 that, when the observations in the samples 1 and 4 to 8 is compared to the theoretical curve, the observations in the actual samples are substantially coincident to a tendency shown by the theoretical curve, though the coherent growth regions in the actual samples are larger than that in the theoretical curve. Therefore, when the film thickness of the second cladding layer 8 is equal to or smaller than the critical film thickness represented by the theoretical curve, the second cladding layer 8 is able to be coherently grown. It may be said from the theoretical curve and the observations that the critical film thickness when the Al composition ratio is 0.07 is about 250 nm, and the critical film thickness when the Al composition ratio is 0.06 is about 400 nm.

Moreover, it was found out from findings by the inventors of the disclosure that, to coherently grow an AlGaN layer up to a film thickness of 400 nm, a critical Al composition ratio was about 6%. In other words, to grow the AlGaN layer to a film thickness of 400 nm or larger, the composition of the second cladding layer 8 is preferably $Al_{x2}Ga_{1-x2}N$, where $x2 \leq 0.06$.

A preferable composition of the second cladding layer 8 obtained from the experimental results in FIG. 7 is determined only in consideration of the case where the second cladding layer 8 is formed of ternary AlGaN. Therefore, the composition of the second cladding layer 8 formed of quaternary InAlGaN was studied. The composition of an epitaxial layer allowed to be coherently grown was determined as below in terms of lattice mismatch.

Typically, the lattice mismatch of an epitaxial layer with respect to a substrate is determined by a ratio of a difference in lattice constant between the substrate and the epitaxial layer to the lattice constant of the substrate. In other words, the lattice mismatch is represented by da/a, where da=a'−a, the lattice constant of the substrate is "a", and the lattice constant of the epitaxial layer is "a'". These lattice constants a and a' are determined by a general expression called "Vegard's law".

As described above, it was found out that a critical value of the Al composition ratio allowing the AlGaN layer to be coherently grown on a semiconductor substrate made of GaN up to a film thickness of about 400 nm was 0.06. Therefore, the lattice mismatch of an AlGaN layer with an Al composition ratio of 0.06 with respect to the substrate made of GaN is represented by the following mathematical expression 1.

$$\frac{da}{a} = -0.00145 \qquad \text{[Mathematical Expression 1]}$$

where da=a'−a, "a'" is an a-axis lattice constant of $Al_{0.06}Ga_{0.94}N$, and "a" is an a-axis lattice constant of the GaN substrate.

Therefore, when $|da/a| \leq 0.00145$ is established, the epitaxial layer (the AlGaN layer) is coherently grown while maintaining lattice continuity.

Figure 8:
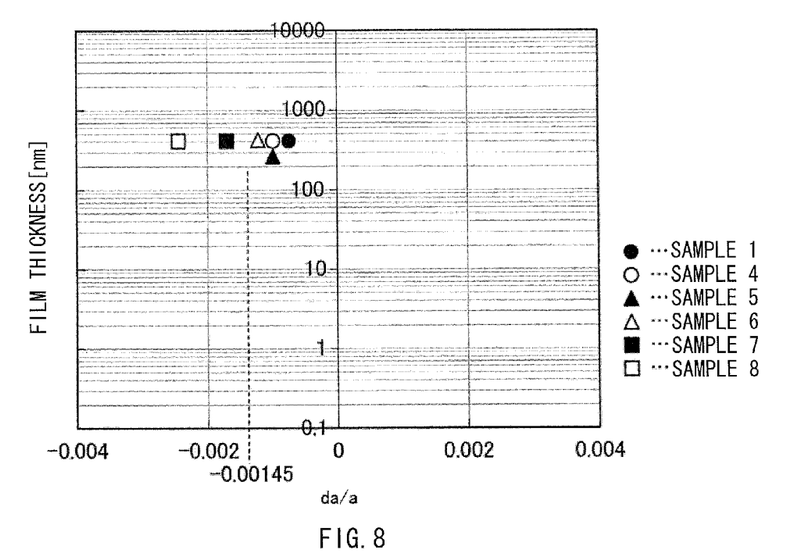
FIG. 8 is a plot illustrating results of the sample 1 and the samples 4 to 8 in terms of a lattice mismatch.

FIG. 8 is a plot illustrating results of the samples 1 and 4 to 8 in terms of lattice mismatch. In FIG. 8, a horizontal axis represents the lattice mismatch, and a vertical axis represents the film thickness. Such a relationship between the lattice mismatch and the film thickness is applicable to the case where the second cladding layer 8 is configured of a quaternary InAlGaN layer. Therefore, in the case where the second cladding layer 8 is configured of an InAlGaN layer, a composition satisfying a condition represented by the following mathematical expression 2 may be selected.

$$\left|\frac{da}{a}\right| \leq 0.00145 \qquad \text{[Mathematical Expression 2]}$$

where $da=a'-a$, and "$a'$" is a lattice constant of $In_{x2}Al_{y2}Ga_{1-x2-y2}N$, and "$a$" is a lattice constant of a GaN substrate.

Next, in terms of threshold current, the composition of the second cladding layer 8 was studied. A general expression of threshold current density $J_{th}$ in a laser diode device is shown in a mathematical expression 3.

$$J_{th} = \frac{J_o d}{\eta} + \left(\frac{J_o d}{g_o \eta \Gamma}\right)\left[\alpha_i + \frac{1}{2L}\ln\left(\frac{1}{R_r R_f}\right)\right] \qquad \text{[Mathematical Expression 3]}$$

where $\eta$ is internal quantum efficiency, d is a thickness of an active layer, $\Gamma$ is an optical confinement factor, $\alpha_i$ is internal loss, L is a resonator length, $R_f$ and $R_r$ are facet reflectivity of a front surface and a back surface, respectively, $J_0$ is necessary current density obtaining a gain, and $g_0$ is a gain.

A simplified relationship between a right-hand side and a left-hand side of the mathematical expression 3 is represented by a mathematical expression 4.

$$J_{th} \propto \alpha_i / \Gamma \qquad \text{[Mathematical Expression 4]}$$

Figure 9:
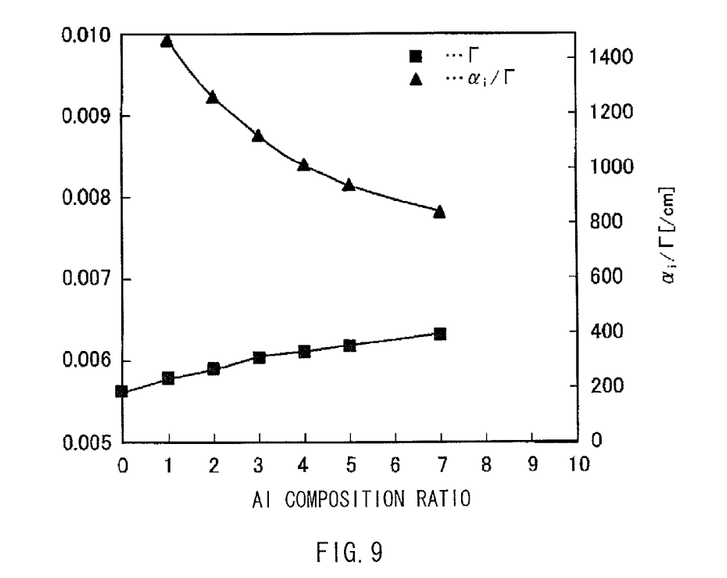
FIG. 9 is a plot illustrating calculation results showing dependence of internal loss $\alpha_1$ and an optical confinement factor $\Gamma$ on an Al composition ratio of the second cladding layer.

It is found out from the mathematical expression 4 that, in the laser diode device, the smaller the internal loss $\alpha_i$ is, the lower the threshold current is obtained, and the larger the optical confinement factor $\Gamma$ is, the lower the threshold current is obtained. FIG. 9 illustrates calculation results representing dependence of the internal loss $\alpha_i$ and the optical confinement factor $\Gamma$ on the Al composition ratio of the second cladding layer 8. In FIG. 9, a horizontal axis represents the Al composition ratio (%) of the second cladding layer 8, and a vertical axis represents the optical confinement factor $\Gamma$ and a ratio $\alpha_i/\Gamma$ (/cm) of the internal loss $\alpha_i$ to the optical confinement factor $\Gamma$.

It was found out from FIG. 9 that the optical confinement factor $\Gamma$ was increased with an increase in the Al composition ratio of the second cladding layer 8. On the other hand, it was found out that the internal loss $\alpha_i$ was decreased with an increase in the Al composition ratio, and as a result, the ratio $\alpha_i/\Gamma$ (/cm) of the internal loss $\alpha_i$ to the optical confinement factor $\Gamma$ was decreased with an increase in the Al composition ratio of the second cladding layer 8. It is found out from this result that, in the laser diode device 13 according to the embodiment, the larger the Al composition ratio of the second cladding layer 8 is, the lower the threshold current is obtained.

Therefore, lasers were fabricated with use of samples (laser diode devices) 9 to 13 with different Al composition ratios y2 and different dopant amounts in the second cladding layer 8 made of $In_{x2}Al_{y2}Ga_{1-x2-y2}N$, where x2=0 and y2>0, to measure the threshold current. The compositions of the samples 9 to 13 will be described below.

[Sample 9]
The sample 9 has the same configuration as the sample 1, and will not be further described.

[Sample 10]
The sample 10 is different from the sample 9 in only the impurity concentrations in the first crystal layer and the second crystal layer configuring the second cladding layer 8. Other configurations are similar to those in the sample 9, and will not be further described.

[Sample 11]
The sample 11 is different from the sample 1 in only the composition of the second cladding layer 8; therefore, only the configuration of the second cladding layer 8 will be described below, and the configurations of the other layers will not be further described.

The second cladding layer 8 in the sample 11 had a two-layer configuration including a first crystal layer and a second crystal layer formed in this order of closeness to the second light guide layer 7. In the sample 11, the first crystal layer and the second crystal layer of the second cladding layer 8 were configured of p-type $Al_{0.035}Ga_{0.965}N$ layers with different impurity concentrations, each having a thickness of 200 nm. Moreover, in the first crystal layer and the second crystal layer of the second cladding layer 8, Mg was used as a p-type impurity.

[Sample 12]
The sample 12 is different from the sample 11 in only the impurity concentrations of the first crystal layer and the second crystal layer configuring the second cladding layer 8. Other configurations are similar to those in the sample 11, and will not be further described.

[Sample 13]
The sample 13 is different from the sample 1 in only the composition of the second cladding layer 8; therefore, only the configuration of the second cladding layer 8 will be described below, and the configurations of the other layers will not be further described.

The second cladding layer 8 in the sample 13 had a two-layer configuration including a first crystal layer and a second crystal layer formed in this order of closeness to the second light guide layer 7. In the sample 13, the first crystal layer and the second crystal layer of the second cladding layer 8 were configured of p-type $Al_{0.04}Ga_{0.96}N$ layers with different impurity concentrations, each having a thickness of 200 nm. Moreover, in the first crystal layer and the second crystal layer of the second cladding layer 8, Mg was used as a p-type impurity.

Figure 10:
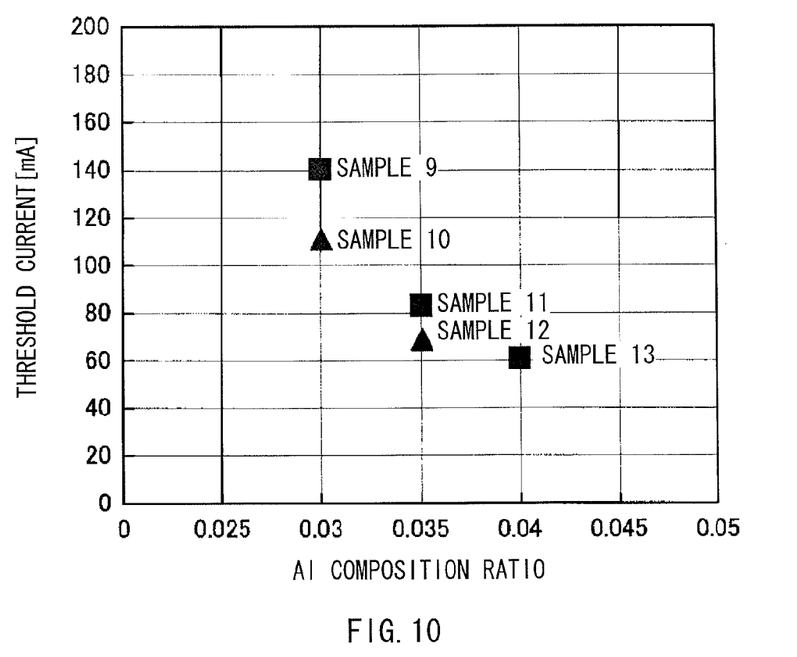
FIG. 10 is a plot illustrating experimental results obtained through measuring variations in a threshold current with varying an Al composition ratio of the second cladding layer.

FIG. 10 illustrates experimental results obtained through measuring variations in the threshold current when the Al composition ratio of the second cladding layer 8 was varied. The results obtained through measuring the threshold currents in the samples 9 to 13 show a tendency to reduce the threshold current with an increase in the Al composition ratio, being consistent with the calculation results illustrated in FIG. 9.

Factors determining the internal loss $\alpha_i$ includes the dopant amount in addition to the Al composition ratio. In the case where the dopant amount varies in spite of the same Al composition ratio (the same optical confinement), the internal loss $\alpha_i$ varies, and the threshold current varies, and as illustrated in FIG. 10, when the dopant amount varies, the threshold current tends to be reduced with an increase in the Al composition ratio.

Moreover, since the threshold current varies by the composition or the film thickness of a light guide layer, the threshold current is not uniquely determined; however, the Al composition ratio in the second cladding layer 8 is preferably about 0.03 or over in terms of the Al composition ratio of the second cladding layer 8. Moreover, it is found out from FIG. 10 that there is a noticeable difference in the threshold current between the case where the Al composition ratio of the second cladding layer 8 is 0.03 and the case where the Al composition ratio of the second cladding layer is 0.035, and when the Al composition ratio of the second cladding layer 8 is about 0.035 or over, a further reduction in the threshold current is achievable. Moreover, since a qualitatively favorable match between the experimental results and the calculation results is shown, when Al composition ratio is smaller than about 0.03, the threshold current is expected to be about 200 mA or over from a calculation result, which is not preferable in terms of characteristics. In other words, in the embodiment, the Al composition ratio of the second cladding layer 8 is preferably about 0.03 or over, and more preferably about 0.035 or over.

A preferable composition of the second cladding layer 8 obtained from the experimental results in FIG. 10 is considered only in the case where the second cladding layer 8 is formed of ternary AlGaN. Therefore, the composition in the case where the second cladding layer 8 is formed of quaternary InAlGaN will be studied below. The optical confinement factor Γ is related to refractive indices of respective layers, and the refractive indices of the respective layers are related to a band gap. Accordingly, with InAlGaN having a band gap equivalent to a band gap of AlGaN (with an Al composition ratio of about 0.03 or over), an optical confinement effect equivalent to that in the above-described samples 9 to 13 is obtained, and a reduction in the threshold current may be achieved.

The band gap in the case where the second cladding layer 8 is made of $Al_{0.03}Ga_{0.97}N$ is Eg=3.45 eV (359.27 nm in wavelength), and the band gap is increased with an increase in the Al composition ratio. In other words, a relationship of the Al composition ratio y2≥0.03 in $Al_{y2}Ga_{1-y2}N$ is expressed in terms of band gap as Eg≥3.45 eV. Therefore, even in the case where the second cladding layer 8 is made of quaternary InAlGaN, as long as the band gap is within a range of Eg≥3.45 eV, an optical confinement effect similar to that in AlGaN is obtained, and a reduction in threshold current may be achieved.

Figure 11:
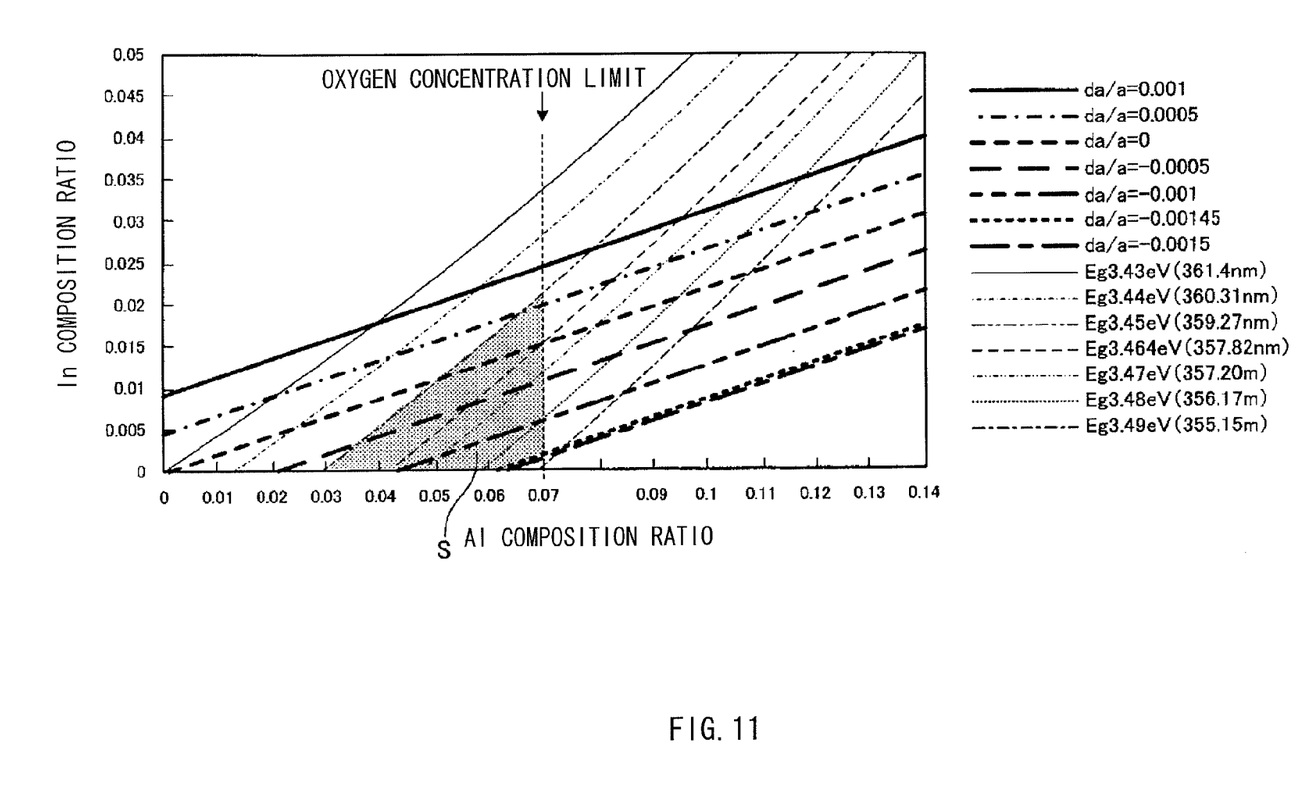
FIG. 11 is a plot illustrating preferable ranges of an Al composition ratio y2 and an In composition ratio x2 of $In_{x2}Al_{y2}Ga_{1-x2-y2}N$ forming the second cladding layer, based on the experimental results.

The above-described experimental results will be summarized below. FIG. 11 is a plot illustrating preferable ranges of the Al composition ratio y2 and the In composition ratio x2 in $In_{x2}Al_{y2}Ga_{1-x2-y2}N$ forming the second cladding layer 8, based on the above-described experimental results. In FIG. 11, a horizontal axis represents the Al composition ratio y2, and a vertical axis represents the In composition ratio x2.

First, the preferable range of the Al composition ratio y2 of the second cladding layer 8 in terms of an oxygen concentration limit was y2≤about 0.07, as illustrated in FIGS. 4 and 5. Therefore, the upper limit of the Al composition ratio y2 in $In_{x2}Al_{y2}Ga_{1-x2-y2}N$ forming the second cladding layer 8 is about 0.07, and when the Al composition ratio y2 is equal to or smaller than about 0.07, the oxygen concentration in the second cladding layer 8 is suppressed, and electrical resistance when energized is also reduced, therefore, a reduction in voltage is achievable.

On the other hand, in terms of the critical film thickness, the preferable range of the Al composition ratio y2 allowing the second cladding layer 8 to be coherently grown up to a film thickness of about 400 nm is y2≤about 0.06. Moreover, in terms of lattice mismatch, to grow the second cladding layer 8 up to a thickness of about 400 nm, the second cladding layer 8 is preferably configured of an $In_{x2}Al_{y2}Ga_{1-x2-y2}N$ layer satisfying the above-described mathematical expression 2.

Moreover, in terms of threshold current, the preferable range of the Al composition ratio y2 of the second cladding layer 8 made of $Al_{y2}Ga_{1-y2}N$ was y2≥about 0.03, as illustrated in FIG. 10. Therefore, the lower limit of the Al composition ratio y2 of $Al_{y2}Ga_{1-y2}N$ forming the second cladding layer 8 is about 0.03, and when the Al composition ratio y2 is equal to or larger than about 0.03, the optical confinement factor Γ is increased and the internal loss $α_i$ is decreased, and a reduction in the threshold current is achievable accordingly. Moreover, in terms of band gap, when the second cladding layer 8 made of $In_{x2}Al_{y2}Ga_{1-x2-y2}N$ has a band gap within a range of Eg≥about 3.45 eV, a reduction in threshold current is achievable.

Preferable ranges of the Al composition and the In composition, determined by the above experimental results, in the $In_{x2}Al_{y2}Ga_{1-x2-y2}N$ layer configuring the second cladding layer 8 in the embodiment are hatched in a graph in FIG. 11 (refer to a region S in FIG. 11). It is found out from FIG. 11 that the preferable range of the In composition ratio x2 in the second cladding layer 8 is 0≤x2≤about 0.02. In the laser diode device 13 according to the embodiment, when the second cladding layer 8 made of $In_{x2}Al_{y2}Ga_{1-x2-y2}N$ is formed with a composition within the region S illustrated in FIG. 11, a laser diode device with a reduced voltage and a reduced threshold current is obtainable.

It is to be noted that, in the above-described embodiment, an example in which the first cladding layer 4 is disposed closer to the semiconductor substrate 1; however, in the case where a p-type semiconductor substrate is used, effects similar to those in the embodiment of the disclosure are obtainable through laminating respective layers from the first cladding layer 4 to the second cladding layer 8 in reverse order. Moreover, the present disclosure is not limited to the above-described embodiment, and may be variously modified without departing from the scope of the embodiment.

The disclosure may have the following configurations.

(1) A semiconductor device including:
  a semiconductor substrate made of a hexagonal Group III nitride semiconductor and having a semi-polar plane; and
  an epitaxial layer formed on the semi-polar plane of the semiconductor substrate and including a first cladding layer of a first conductive type, a second cladding layer of a second conductive type, and a light-emitting layer formed between the first cladding layer and the second cladding layer, the first cladding layer being made of $In_{x1}Al_{y1}Ga_{1-x1-y1}N$, where x1>0 and y1>0, the second cladding layer being made of $In_{x2}Al_{y2}Ga_{1-x2-y2}N$, where 0≤x2≤about 0.02 and about 0.03≤y2≤about 0.07.

(2) The semiconductor device according to (1), in which composition of the second cladding layer is within a range allowing a lattice mismatch da/a with respect to the semiconductor substrate to satisfy |da/a|≤about 0.00145, where da=a'−a, a lattice constant of the semiconductor substrate is "a", and a lattice constant of the epitaxial layer is "a".

(3) The semiconductor device according to (1) or (2), in which the composition of the second cladding layer is determined to allow a band gap of the second cladding layer to be about 3.45 eV or over.

(4) The semiconductor device according to any one of (1) to (3), in which the second cladding layer has a thickness of about 200 nm or over.

(5) The semiconductor device according to any one of (1) to (4), in which an Al composition ratio y2 of the second cladding layer is within a range of about 0.035≤y2≤about 0.06.

(6) The semiconductor device according to any one of (1) to (5), in which an In composition ratio x2 of the second cladding layer is 0.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor device comprising:
a semiconductor substrate made of a hexagonal Group III nitride semiconductor and having a semi-polar plane; and
an epitaxial layer formed on the semi-polar plane of the semiconductor substrate and including an n-type cladding layer, a p-type cladding layer, and a light-emitting layer formed between the n-type cladding layer and the p-type cladding layer, the n-type cladding layer comprised of $In_{x1}Al_{y1}Ga_{1-x1-y1}N$, where x1>0 and y1>0, the p-type cladding layer comprised of $In_{x2}Al_{y2}Ga_{1-x2-y2}N$, where 0≤x2≤about 0.02 and about 0.03≤y2≤about 0.07, wherein all of the layers of the epitaxial layer are formed by a coherent growth, and
wherein an oxygen concentration in the p-type cladding layer is less than or equal to $4.0 \times 10^{17}/cm^3$.

2. The semiconductor device according to claim 1, wherein composition of the p-type cladding layer is within a range allowing a lattice mismatch da/a with respect to the semiconductor substrate to satisfy |da/a|≤about 0.00145, where da=a'−a, a lattice constant of the semiconductor substrate is "a", and a lattice constant of the epitaxial layer is "a'".

3. The semiconductor device according to claim 2, wherein the composition of the p-type cladding layer is determined to allow a band gap of the p-type cladding layer to be about 3.45 eV or over.

4. The semiconductor device according to claim 3, wherein the p-type cladding layer has a thickness of about 200 nm or over.

5. The semiconductor device according to claim 4, wherein an Al composition ratio y2 of the p-type cladding layer is within a range of about 0.035≤y2≤about 0.06.

6. The semiconductor device according to claim 5, wherein an In composition ratio x2 of the p-type cladding layer is 0.

* * * * *